(12) United States Patent
Kikushima (10) Patent No.: US 7,397,172 B2
(45) Date of Patent: Jul. 8, 2008

(54) PIEZOELECTRIC RESONATOR ELEMENT, PIEZOELECTRIC DEVICE AND GYRO SENSOR

(75) Inventor: Masayuki Kikushima, Ina (JP)

(73) Assignee: Seiko Epson Corporation (JP)

( * ) Notice: Subject to any disclaimer, the term of this patent is extended or adjusted under 35 U.S.C. 154(b) by 136 days.

(21) Appl. No.: 11/252,704

(22) Filed: Oct. 18, 2005

(65) Prior Publication Data

US 2006/0087205 A1    Apr. 27, 2006

(30) Foreign Application Priority Data

Oct. 21, 2004  (JP)  ............... 2004-306888
Apr. 15, 2005  (JP)  ............... 2005-118400

(51) Int. Cl.
*H01L 41/00*  (2006.01)

(52) U.S. Cl. ............ 310/370; 310/317; 310/321; 333/200; 73/504.02; 331/156

(58) Field of Classification Search ........... 310/370; 73/504.02

See application file for complete search history.

(56) References Cited

U.S. PATENT DOCUMENTS

2004/0085163 A1 * 5/2004 Kikushima ............... 333/200
2006/0066185 A1 * 3/2006 Tanaya ..................... 310/370

FOREIGN PATENT DOCUMENTS

| EP | 0 821 481 A2 | 1/1998 |
| JP | 57-60718 | 4/1982 |
| JP | 57060718 | * 4/1982 |
| JP | 57-199314 | 12/1982 |
| JP | 2002-076806 | 3/2002 |
| JP | 2003-207338 | 7/2003 |
| JP | 2004-236008 | 8/2004 |
| JP | 2004-245605 | 9/2004 |

OTHER PUBLICATIONS

Communication from European Patent Office regarding related application.

* cited by examiner

*Primary Examiner*—Darren Schuberg
*Assistant Examiner*—Bryan P Gordon
(74) *Attorney, Agent, or Firm*—Harness, Dickey & Pierce, P.L.C.

(57) ABSTRACT

A piezoelectric resonator element, comprises: a base made of a piezoelectric material; at least a pair of resonating arms provided in a unified manner with the base and extending in parallel with each other from the base; a portion defining a long groove provided to each of the resonating arms along a longitudinal direction; and a driving electrode provided to the long groove. Each of the resonating arms includes a structure to adjust hardness balance between right and left structures with respect to a virtual central line extending in the longitudinal direction.

12 Claims, 11 Drawing Sheets

PIEZOELECTRIC RESONATOR ELEMENT, PIEZOELECTRIC DEVICE AND GYRO SENSOR

BACKGROUND OF THE INVENTION

1. Technical Field

The present invention relates to a piezoelectric resonator element to be housed in a package or case, a piezoelectric device in which the piezoelectric resonator element is housed in a package or a case, and a gyro sensor.

2. Related Art

Piezoelectric devices, including a piezoelectric resonator and a piezoelectric oscillator housing a piezoelectric resonator element in a package, have been widely used for small information equipment, such as hard disc drives (HDD), mobile computers and integrated circuit (IC) cards, for mobile communications equipment, such as cellular phones, car phones and paging systems, and for measuring instruments such as gyro sensors.

Figure 13:
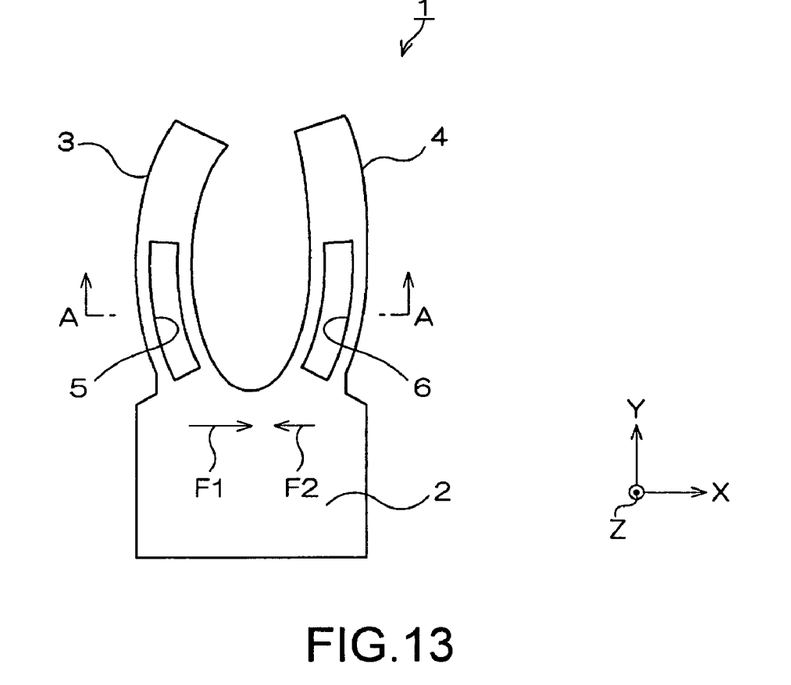
FIG. 13 is a schematic plan view of a related art piezoelectric resonator element.

FIG. 13 is a plan view schematically showing a publicly known structure example of a piezoelectric resonator element that is used for such a piezoelectric device. JP-A-2002-76806 is an example of related art.

Figure 14:
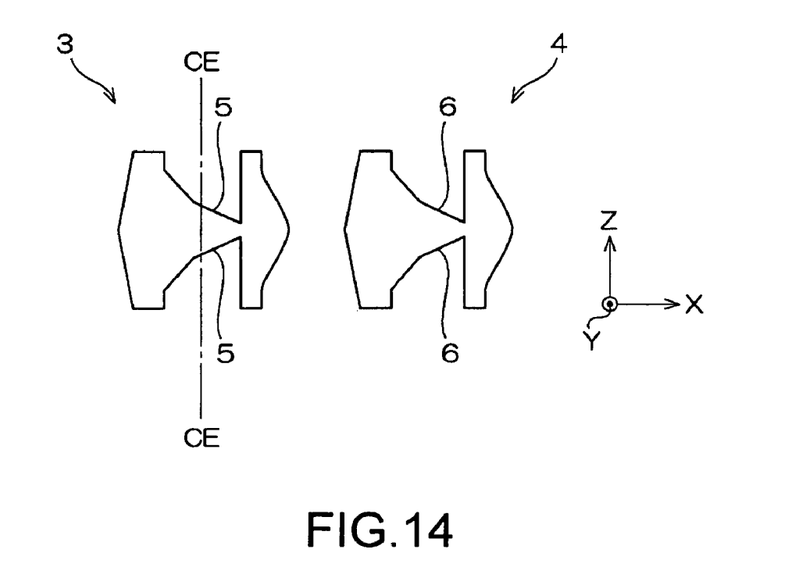
FIG. 14 is a sectional view along line A-A of FIG. 13.

Referring to the drawing, this piezoelectric resonator element 1 is made of single-crystal quartz, for example, and includes a base 2 having an extra width and two resonating arms 3, 4 extending in parallel with each other from the base 2 in one direction. FIG. 14 is a sectional view along line A-A of FIG. 13. Long grooves 5, 6 are provided to the front and back surfaces of the resonating arms 3, 4, respectively, along their longitudinal direction. To the long grooves 5, 6, an excitation electrode (not shown) is provided as a driving electrode.

A driving voltage applied to the excitation electrode from outside effectively produces an electric field in the resonating arms 3, 4. Consequently, the resonating arms 3, 4 perform flexural vibration in a way that their end parts move closer to and away from each other as shown in FIG. 13. A vibration frequency based on this vibration is output to be used for a reference signal, such as a controlling clock signal.

The resonating arms 3, 4 included in the piezoelectric resonator element 1 and the long grooves 5, 6 of the resonating arms 3, 4 are formed by etching a substrate made of a piezoelectric wafer material. In general, a wafer substrate is etched to provide the outer shape of a tuning fork as shown in FIG. 13. Then the long grooves 5, 6 as shown in FIG. 14 are formed by half etching.

This piezoelectric resonator element 1, however, involves the following problem. In wet etching for forming the outer shape, etching progresses at different rates in the electrical axis X, the mechanical axis Y and the optical axis Z shown in FIGS. 13 and 14. Due to this etching anisotropy, the long grooves 5, 6 are not provided with a flat base.

As a result, the right and left side walls of the resonating arm 3, for example, that sandwich the long groove 5 are different in thickness. Therefore, the side walls of the resonating arm 3 on the right and left of the virtual central line CE shown in FIG. 13 have different hardness. Specifically, the left side wall is harder than the right side wall.

Under the state where the resonating arms 3, 4 are performing flexural vibration as shown in FIG. 13, the degree of flexure deformation different between right and left in the respective horizontal directions. Consequently, flexure of the right and left resonating arms 3, 4 is out of balance. As a result, stresses F1 and F2 transmitted to the base 2 because of the deformation of the resonating arms 3, 4 are not equal and do not negate each other, thereby causing Z-axial or Y-axial displacement. Consequently, crystal impedance (CI) is considered to increase.

SUMMARY

An advantage of the invention is to provide a piezoelectric resonator element, a piezoelectric device and a gyro sensor in which vibration balance is improved so as to keep CI low.

A piezoelectric resonator element according to a first aspect of the invention includes a base made of a piezoelectric material, at least a pair of resonating arms provided in a unified manner with the base and extending in parallel with each other from the base, a portion defining a long groove provided to each of the resonating arms along their longitudinal direction, and a driving electrode provided to the long groove. Each of the resonating arms includes a structure to adjust hardness balance between right and left structures with respect to a virtual central line extending in the longitudinal direction.

With this structure of the first aspect of the invention, the resonating arms include a structure to adjust hardness balance between right and left structures with respect to the virtual central line extending in their longitudinal direction, thereby eliminating or reducing displacement components in unnecessary directions. Accordingly, vibration balance during flexural vibration becomes stable, and thus CI can be kept low.

In a second aspect of the invention, with the structure of the first aspect of the invention, a right constricted portion and a left constricted portion with respect to the virtual central line are provided to a base portion of each of the resonating arms so as to make the width of the resonating arms large on the base side and make the width sharply reduce toward each end portion, and the right constricted portion is made larger than the left constricted portion as the structure to adjust.

This structure of the second aspect of the invention deals with the thickness difference between right and left walls of the long groove of each resonating arm due to etching anisotropy in wet-etching the long groove. In particular, by making the right constricted portion large at the base portion, which has the largest distortion when each arm is performing flexural vibration, hardness imbalance due to the thin wall on the right of the long groove can be reduced.

In a third aspect of the invention, with the structure of the first aspect of the invention, the structure to adjust is provided to a base portion of each of the resonating arms, and a portion defining the long groove as the structure to adjust is provided to make a right wall thereof with respect to the virtual central line that is thicker than a left wall thereof.

This structure of the third aspect of the invention deals with the thickness difference between right and left walls of the long groove of each resonating arm due to etching anisotropy in wet-etching the long groove. In particular, by intentionally making the wall on the right of the long groove thicker than the wall on the left at the base portion, which has the largest distortion when each arm is performing flexural vibration, hardness imbalance due to the thin right wall can be reduced regarding the long groove as a whole.

In a fourth aspect of the invention, with the structure of the first aspect of the invention, the structure to adjust is provided to an end portion of each of the resonating arms, and a left portion with respect to the virtual central line is made larger than a right portion at the end portion of each resonating arm as the structure to adjust.

This structure of the fourth aspect of the invention deals with the thickness difference between right and left walls of the long groove of each resonating arm due to etching anisotropy in wet-etching the long groove. By making one portion on the left of the virtual central line larger than another portion on the right at the base portion of each resonating arm, hardness imbalance due to the right thin wall can be reduced regarding the long groove as a whole.

A piezoelectric device according to a fifth aspect of the invention includes a container and a piezoelectric resonator element housed in the container, and the piezoelectric resonator element includes a base made of a piezoelectric material, at least a pair of resonating arms provided in a unified manner with the base and extending in parallel with each other from the base, a portion defining a long groove provided to each of the resonating arms along their longitudinal direction, and a driving electrode provided to the long groove. Each of the resonating arms includes a structure to adjust hardness balance between right and left structures with respect to a virtual central line extending in the longitudinal direction.

With this structure of the fifth aspect of the invention, in the same principle of the first aspect of the invention, vibration balance becomes stable while the resonating arms included in the piezoelectric resonator element mounted in the piezoelectric device are performing flexural vibration, thereby CI of the device can be kept low.

A gyro sensor according to a sixth aspect of the invention that has a base made of a piezoelectric material and at least a pair of resonating arms provided in a unified manner with the base and extending in parallel with each other from the base includes a portion defining a long groove provided to each of the resonating arms along a longitudinal direction and a driving electrode provided to the long groove. Each of the resonating arms includes a structure to adjust hardness balance between right and left structures with respect to a virtual central line extending in the longitudinal direction.

In the same principle described in the first aspect of the invention, this structure of the sixth aspect of the invention improves vibration balance, thereby CI of the gyro sensor can be kept low.

BRIEF DESCRIPTION OF THE DRAWINGS

The invention will be described with reference to the accompanying drawings, wherein like numbers reference like elements.

DESCRIPTION OF THE EMBODIMENTS

Figure 1:
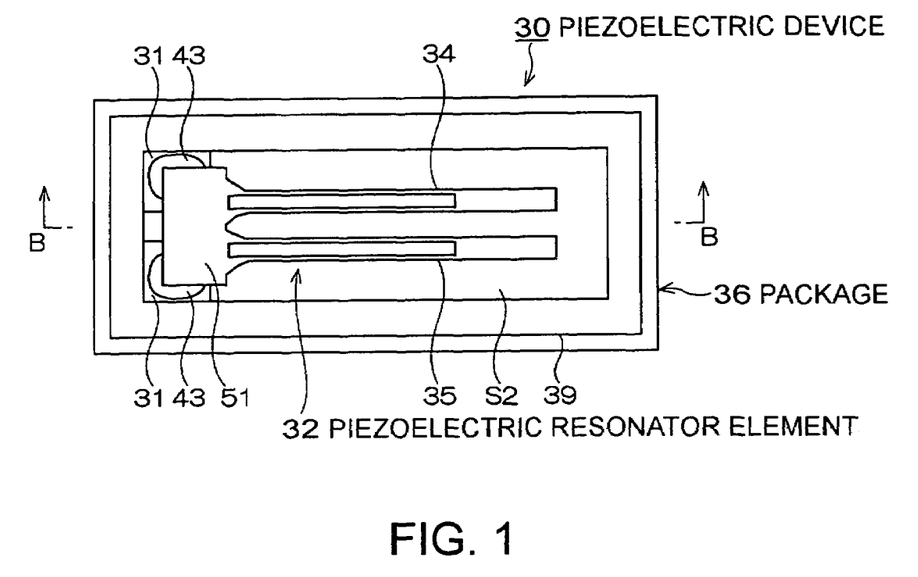
FIG. 1 is a schematic plan view showing a piezoelectric device according to one embodiment of the invention.
Figure 2:
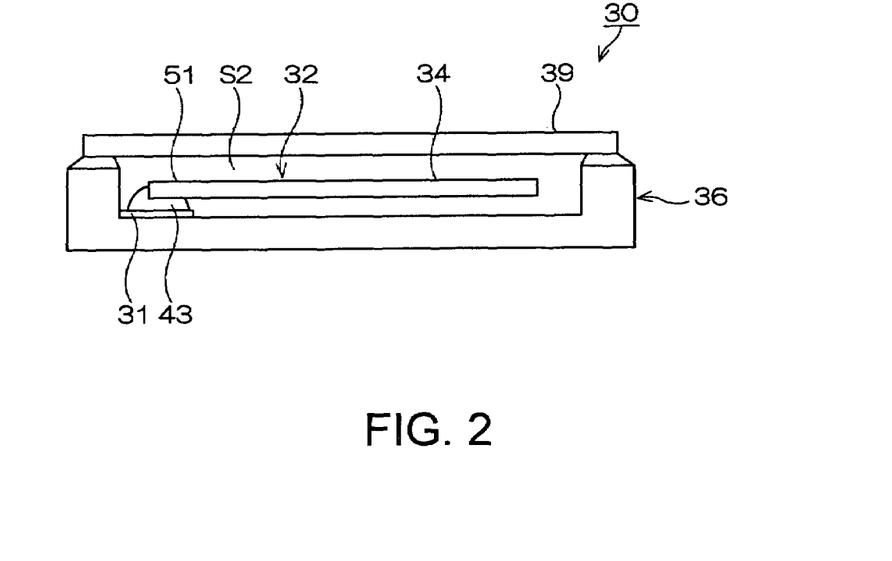
FIG. 2 is a schematic sectional view of the piezoelectric device along line B-B of FIG. 1.

FIGS. 1 and 2 show a piezoelectric device according to a first embodiment of the invention. FIG. 1 is a schematic plan view thereof. FIG. 2 is a schematic sectional view along line B-B of FIG. 1.

Referring to the drawings, this piezoelectric device 30 is an example including a crystal resonator. The piezoelectric device 30 houses a piezoelectric resonator element 32 in a package 36 as a container. The package 36 is formed, for example, by multilayering a plurality of substrates made of aluminum-oxide ceramic green sheets as an insulating material and then firing the substrates to form a sintered body. The plurality of substrates are provided with a predetermined hole to form an inner space S2 inside when they are multilayered. This inner space S2 is a space for housing the piezoelectric resonator element 32.

The piezoelectric resonator element 32 is mounted inside the package 36, and a lid 39 is used for airtight sealing. Here, the lid 39 is made of a material, such as ceramic, metal or glass, can be used.

The lid 39 made of metal generally has an advantage in terms of strength over lids made of other materials. The material whose coefficient of thermal expansion approximates that of the package 36 may be an alloy such as KOVAR®.

Also, to adjust a frequency after sealing with the lid, the lid 39 is made of a light transmissive material, e.g. glass. A plate of boron silicate glass can be used, for example.

Near the left end portion in the drawing of the inner space S2 of the package 36, electrode parts 31, 31 that are tungsten metallized and plated thereon with nickel and gold are provided on a multilayered substrate that is an inner bottom exposed to the inner space S2. The electrode parts 31, 31 are coupled to the outside to provide a driving voltage. On the electrode parts 31, 31, conductive adhesives 43, 43 are applied. A base 51 of the piezoelectric resonator element 32 is disposed on each of the conductive adhesives 43, 43, which are to be cured. Examples of the conductive adhesives 43, 43 may include a synthetic resin agent as a bonding adhesive containing conductive particles, such as silver fine particles. Silicone, epoxy and polyimide conductive adhesives can be used.

The piezoelectric resonator element 32 is formed by etching quartz, for example, as a piezoelectric material. According to the present embodiment, the piezoelectric resonator element 32 has the structure schematically shown in FIG. 3 and FIG. 4, which is a sectional view along the line C-C of FIG. 3, in particular to provide required performance with a compact form.

Figure 3:
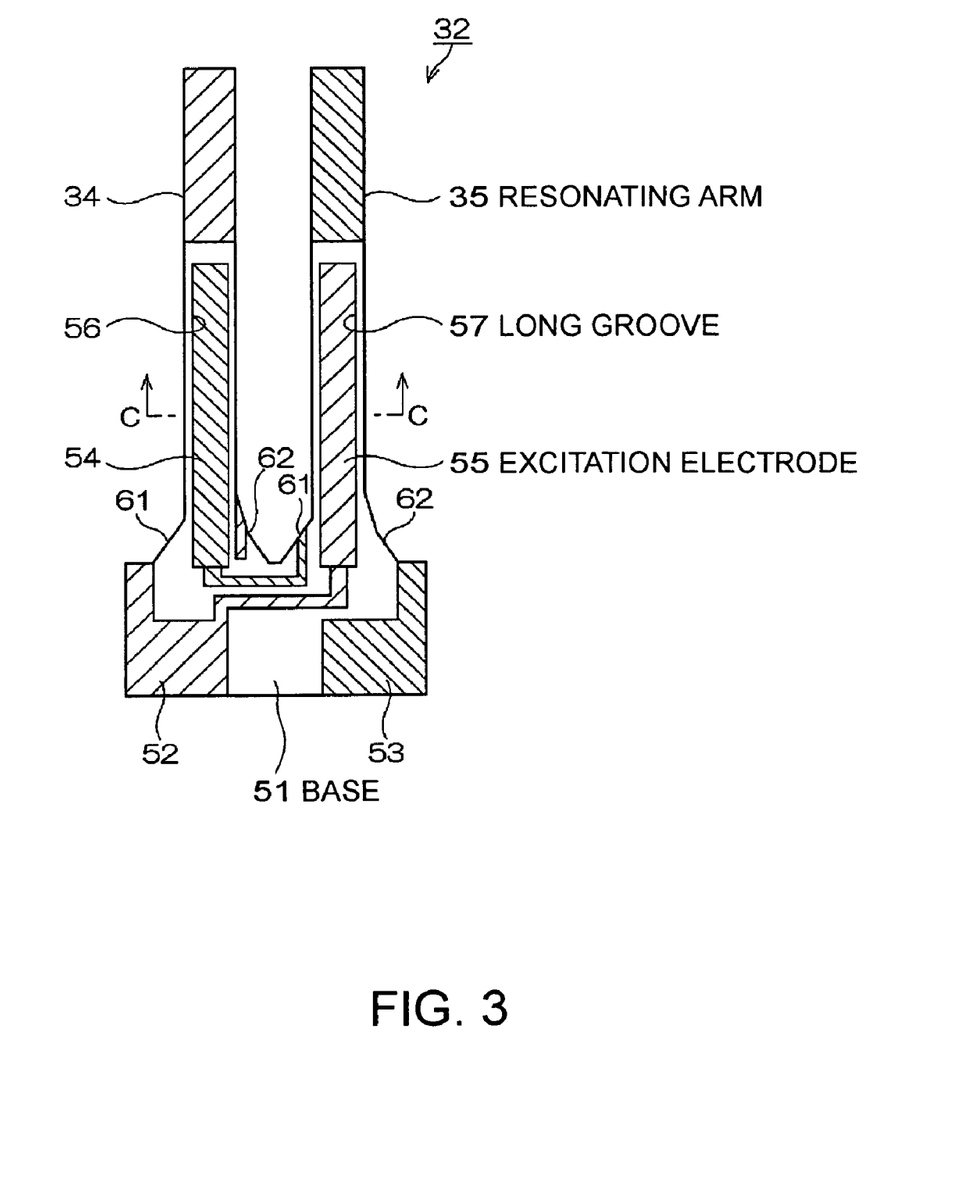
FIG. 3 is a schematic plan view of a piezoelectric resonator element according to the first embodiment used in the piezoelectric device shown in FIG. 1.
Figure 4:
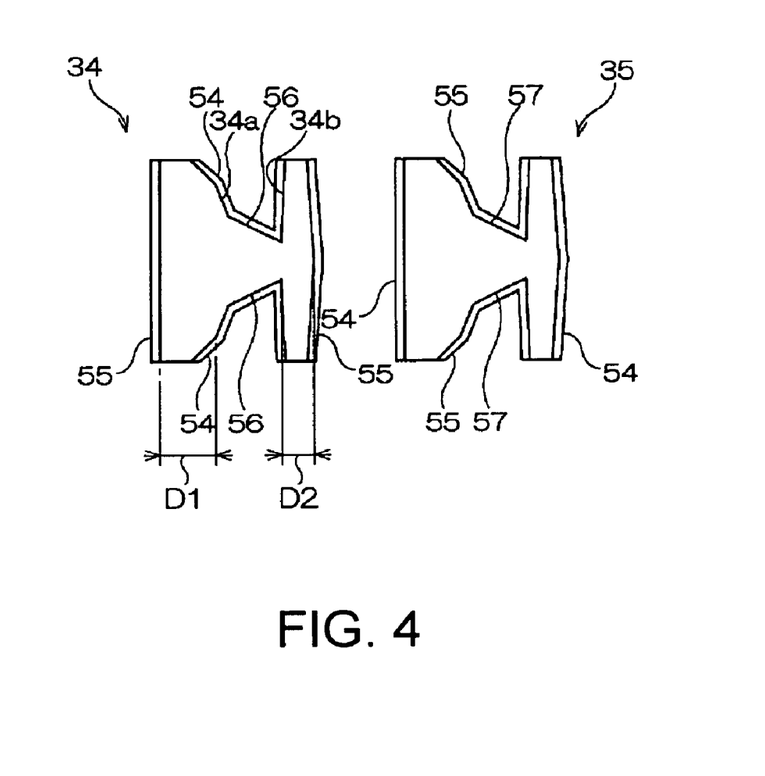
FIG. 4 is a sectional view of the piezoelectric resonator element along line C-C of FIG. 3.

Specifically, the piezoelectric resonator element 32 includes the base 51 and a pair of resonating arms 34, 35. The base 51 is fixed to the package 36 side. The resonating arms 34, 35 extend upward in the drawing in parallel with each other from the base 51. This is a fork piezoelectric resonator element, whose shape is like a tuning fork.

Referring to FIGS. 3, 4, the resonating arms 34, 35 included in the piezoelectric resonator element 32 are provided with long, bottomed grooves 56, 57, respectively, extending along their longitudinal direction. These long grooves 56, 57 are provided on the front and back surfaces of the resonating arms 34, 35, respectively, as shown in FIG. 4, which is a sectional view along line C-C of FIG. 3.

Also as shown in FIG. 3, provided near the both ends in the width direction of the end portion (lower end portion in FIG. 3) of the base 51 included in the piezoelectric resonator element 32 are extraction electrodes 52, 53. The extraction electrodes 52, 53 are also provided on the back surface (not shown) of the base 51 included in the piezoelectric resonator element 32 in the same manner.

Each of the extraction electrodes 52, 53 is a portion coupled to the electrode parts 31, 31 on the package side with the conductive adhesives 43, 43 shown in FIG. 1 as described above. Referring to FIGS. 3, 4, each of the extraction electrodes 52, 53 is also coupled in a unified manner to excitation electrodes 54, 55, respectively, provided in the long grooves 56, 57 of the resonating arms 34, 35. The excitation electrodes 54, 55 are also provided on the both sides of the resonating arms 34, 35 as shown in FIG. 4. Regarding the resonating arm 34, for example, the excitation electrode 54 provided in the long groove 56 and the excitation electrode 55 on the side have opposite polarity. Regarding the resonating arm 35, the excitation electrode 55 provided in the long groove 57 and the excitation electrode 54 on the side have opposite polarity.

Between the base 51 and the resonating arms 34, 35 included in the piezoelectric resonator element 32, a cutout or constricted part (not shown) may be provided by reducing the width of the base 51.

This structure can prevent the vibration of the piezoelectric resonator element 32 from passing through the base 51 side, thereby reducing the CI.

Furthermore, the piezoelectric resonator element 32 is extremely compact as a whole. For example, the overall length of its structure shown in FIG. 3 is about 1300 μm. The resonating arms are about 1040 μm long and about 40 μm to 55 μm wide.

Figure 5:
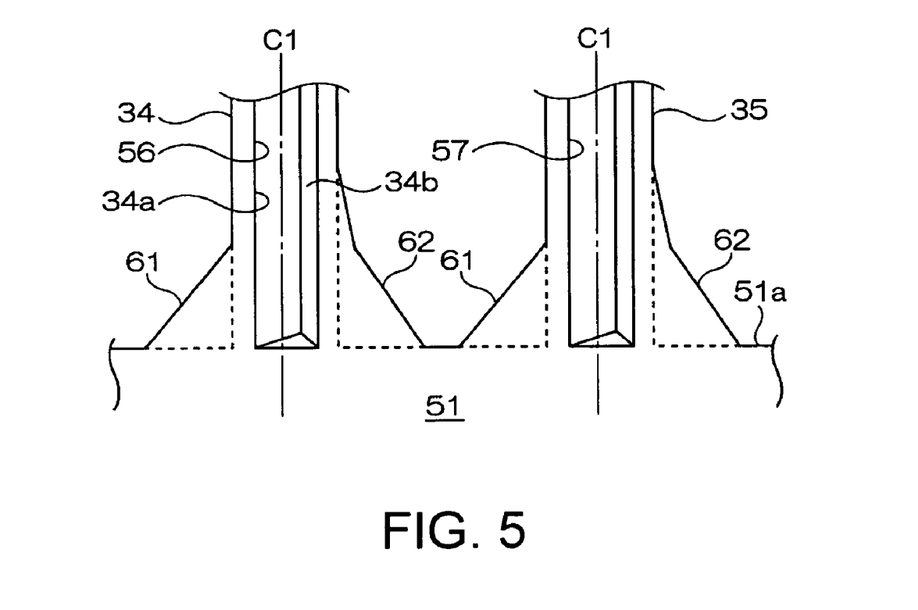
FIG. 5 is an enlarged view showing a major part of the piezoelectric resonator element shown in FIG. 3.

As shown in the partially enlarged view FIG. 5, constricted portions 61, 62 are provided near a base portion of the resonating arms 34, 35, that is, near a front end 51a of the base 51. In the constricted portions 61, 62, the width of the resonating arms 34, 35 is larger on the base 51 side and becomes sharply smaller toward their end sides. The constricted portions 61, 62 are fin-like portions extending toward the base portion of the arms. Specifically, the constricted portion 61 is a fin-like unified part of a nearly right triangle whose one side is along the front end of the base 51 and another adjacent side is along the left edge of the base portion (base end portion) of the resonating arm. The constricted portion 62 is also a fin-like unified part of a nearly right triangle whose one side is along the front end of the base 51 and another adjacent side is along the right edge of the base portion (base end portion) of the resonating arm.

These portions have the same structure with both the resonating arms 34, 35, and the structure with the resonating arm 34 will now be described.

Referring to FIG. 4, as a result of forming the long groove 56 to the resonating arm 34, a thickness D1 of a left wall 34a and a thickness D2 of a right wall 34b sandwiching the long groove 56 differ largely. The left wall 34a is thicker than the right wall 34b.

This difference in wall thickness is due to different etching rates depending on crystal orientation, since the long groove 56 is formed by wet-etching a quartz material that involves etching anisotropy.

According to the present embodiment, the constricted portions 61, 62 are used to adjust the hardness balance between the right and left side of the resonating arm 34 due to the etching anisotropy. The constricted portion 62 on one side of the long groove 56 in the width direction is made large, while the constricted portion 61 on the other side of the long groove 56 in the width direction has a normal size. In other words, when the base 51 is provided in a lower position of FIG. 3 and the resonating arms 34, 35 are provided to extend upward from this base, the constricted portion 62 on the right is made large, while the constricted portion 61 on the left is made smaller to have a normal size as shown in FIGS. 3 and 4.

The sizes of the right and left constricted portions can differ by making the shape of a mask for the wet etching different for the both sides.

Accordingly, by providing the large constricted portion 62 on the right of the resonating arms 34, 35 at the base portion of the arms, which has the largest distortion, the hardness can be increased on the right of the resonating arms 34, 35, while the resonating arms 34, 35 are performing flexural vibration.

Here, the size of the large constricted portion 62 in comparison with the normally sized constricted portion 61 can be determined depending on the difference between the thickness D1 of the left wall and the thickness D2 of the right wall shown in FIG. 4.

Figure 6:
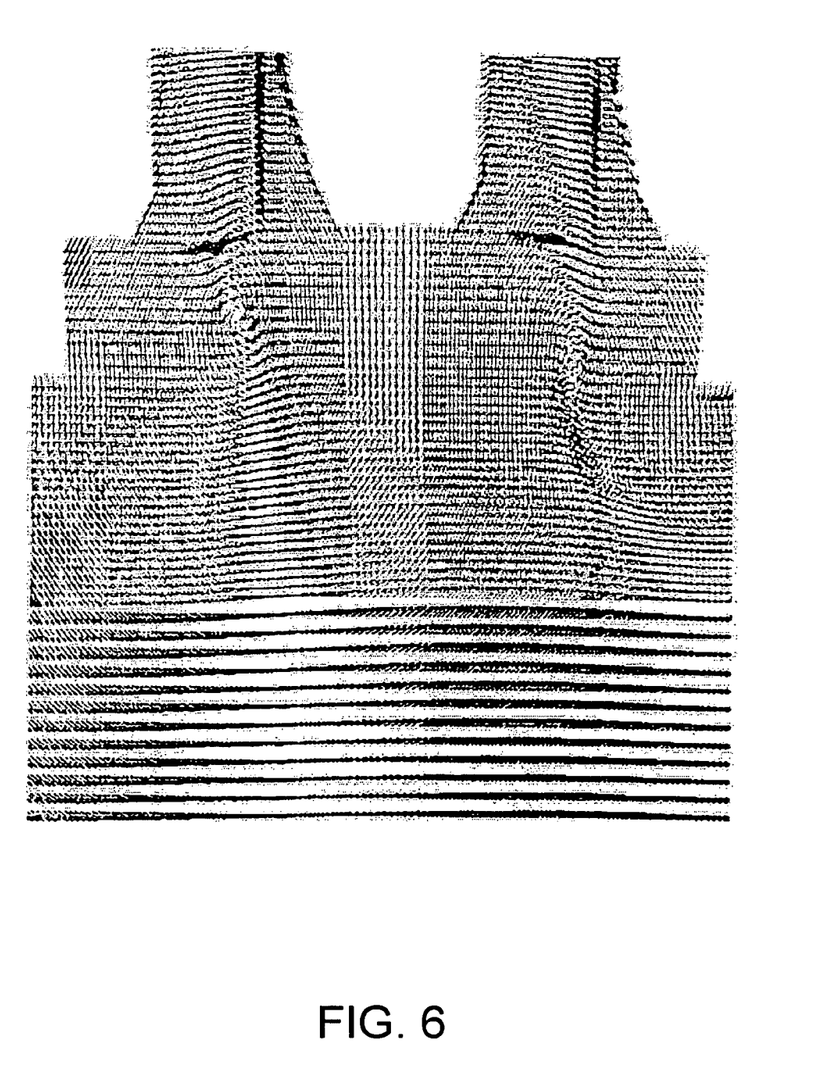
FIG. 6 is a vector diagram showing a simulation of vibration displacement while the resonating arms included in a piezoelectric resonator element of a reference example, which is not included in the invention, is performing flexural vibration.

FIG. 6 is a vector diagram showing a simulation of vibration displacement while each resonating arm included in the piezoelectric resonator element 32 having the structure as shown in FIG. 5 is performing flexural vibration. Referring to the diagram, distortion is small around lower portions of the base, that is, portions corresponding to the extraction electrodes 52, 53 shown in FIG. 3 with this piezoelectric resonator element 32 according to the present embodiment by adjusting and striking the stress balance between the right and left side of each resonating arm.

Figure 7:
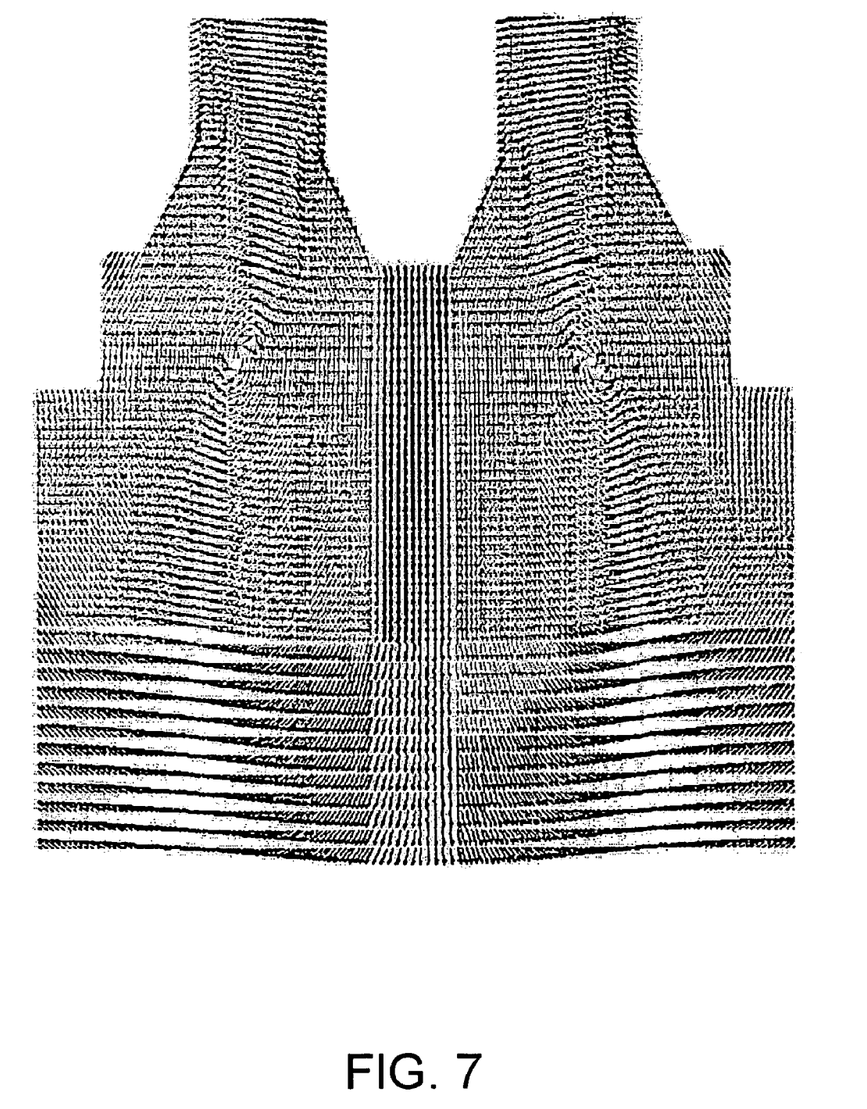
FIG. 7 is a vector diagram showing a simulation of vibration displacement while the resonating arms included in the piezoelectric resonator element according to the first embodiment is performing flexural vibration.

FIG. 7 is a vector diagram showing a simulation of vibration displacement while resonating arms included in a piezoelectric resonator element having constricted portions that have the same width are performing flexural vibration, which differs from the example of the resonating arm 34 shown in FIG. 5 having the normally sized constricted portion 61 on the left and the large constricted portion 62 on the right. In comparison with the example of FIG. 6, the structure of FIG. 7 shows larger distortion around lower portions of the base.

Figure 8:
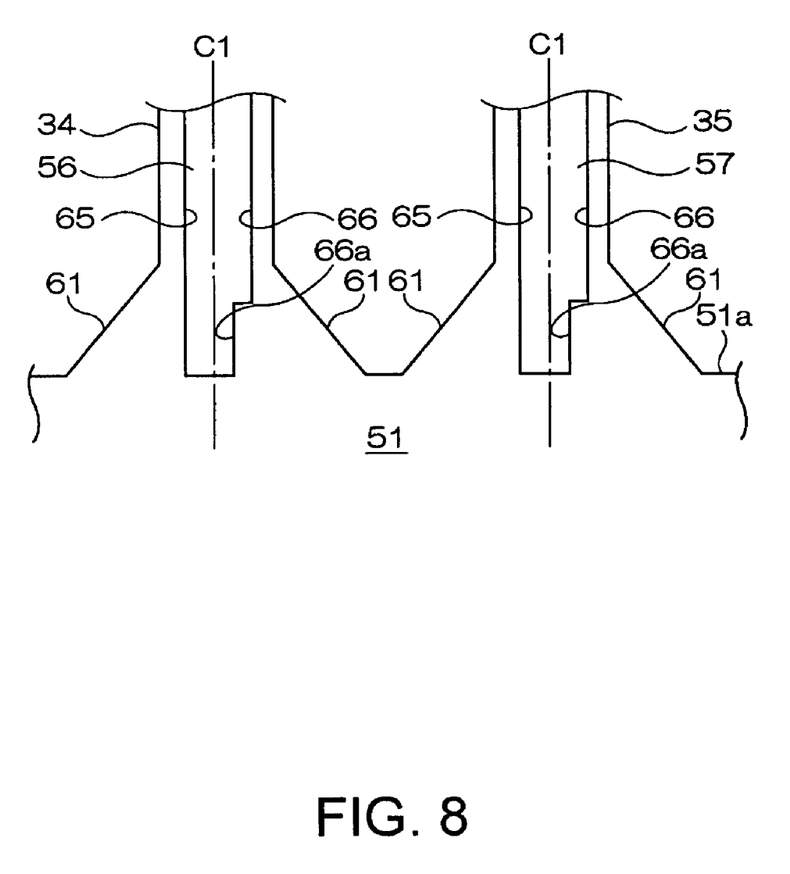
FIG. 8 is an enlarged view showing a major part of a piezoelectric resonator element according to a second embodiment.

FIG. 8 is an enlarged view showing a major part of a piezoelectric resonator element according to a second embodiment. This drawing corresponds to FIG. 5. Parts according to the present embodiment not shown in this drawing are common to the first embodiment shown in FIGS. 1 through 5, and the description thereof will be omitted and differences between the two embodiments will be highlighted here.

Also, since the resonating arms 34, 35 have the same structure, the description below will be about the resonating arm 34 only.

According to the present embodiment, a structure to adjust hardness on the right and left is provided near the front end 51a.

Specifically, in the long groove 56 extending in the longitudinal direction of the resonating arm 34 and sandwiched by a left wall 65 and a right wall 66, part of the right wall 66 has a wider part 66a that is thicker than the left wall 65.

Thus regarding the long groove 56 as a whole, the hardness imbalance between the right and left sides of the resonating arm 34 due to the thin right wall can be reduced.

Figure 9:
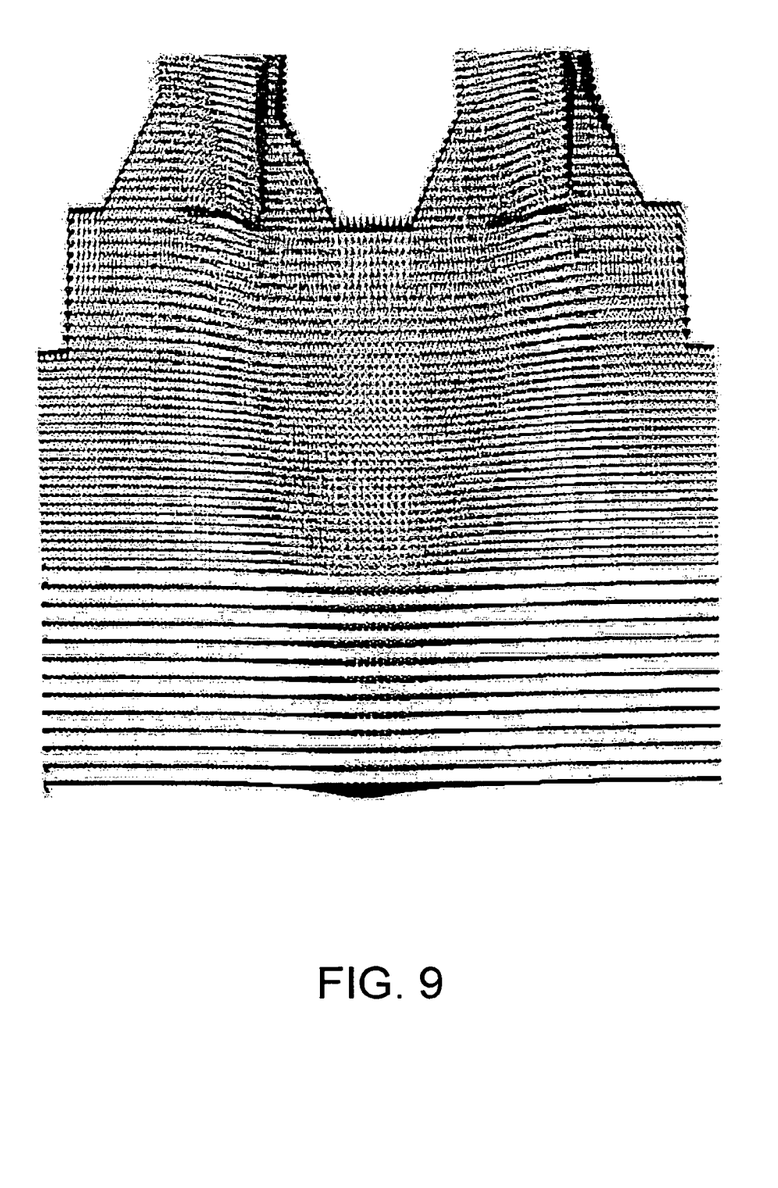
FIG. 9 is a vector diagram showing a simulation of vibration displacement while the resonating arms included in the piezoelectric resonator element according to the second embodiment is performing flexural vibration.

FIG. 9 is a vector diagram showing a simulation of vibration displacement while each resonating arm is performing flexural vibration in the second embodiment. The structure of FIG. 9 shows smaller distortion around lower portions of the base than the structure of FIG. 7.

FIG. 10 is an enlarged view showing a major part of a piezoelectric resonator element according to a third embodiment. The drawing shows part of the piezoelectric resonator element near the ends of the resonating arms 34, 35. Parts according to the present embodiment not shown in this drawing are common to the first embodiment shown in FIGS. 1 through 5, and the description thereof will be omitted and differences between the two embodiments will be highlighted here.

Also, since the resonating arms 34, 35 have the same structure, the description below will be about the resonating arm 34 only.

According to the present embodiment, the right and left ends of each resonating arm acting as plummets while the resonating arm is performing flexural vibration are set to have different weights. This means that corrective weight is applied to deal with the hardness imbalance due to the thickness difference between the right and left walls of the long groove.

In other words, the left end portion is made larger than the right end portion of the resonating arm 34 as shown in FIG. 10.

Figure 10A:
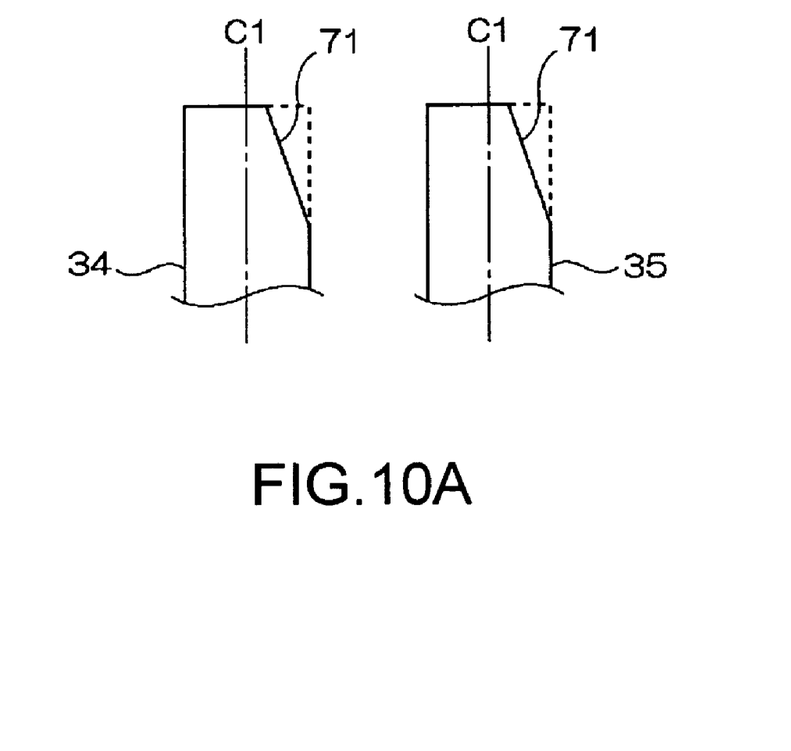
FIG. 10 is an enlarged view showing a major part of a piezoelectric resonator element according to a third embodiment.

Specifically, as shown in FIG. 10A for example, a cutout part 71 is formed to diagonally remove the material on the right side of the end portion of the resonating arm 34, thereby reducing the weight on the right of the virtual central line C1 in comparison with the weight on the left.

Figure 10B:
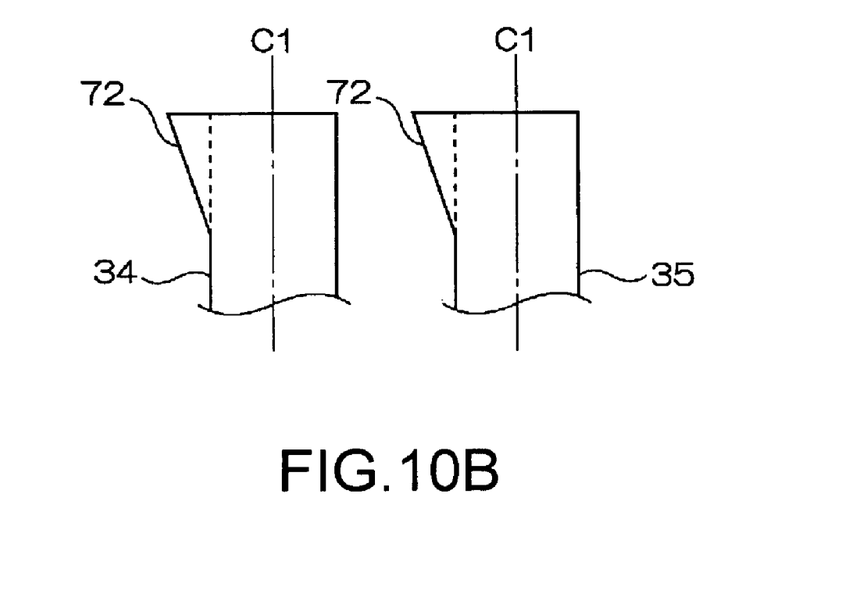

Also, as shown in FIG. 10B for example, a convex part 72 is formed in a unified manner to increase the material on the left of the virtual central line C1 at the end portion of the resonating arm 34, thereby increasing the weight on the left in comparison with the weight on the right.

The present embodiment can also reduce the hardness imbalance between the right and left sides of the resonating arm 34 due to the thin right wall 66 regarding the long groove 56 as a whole.

Figure 11:
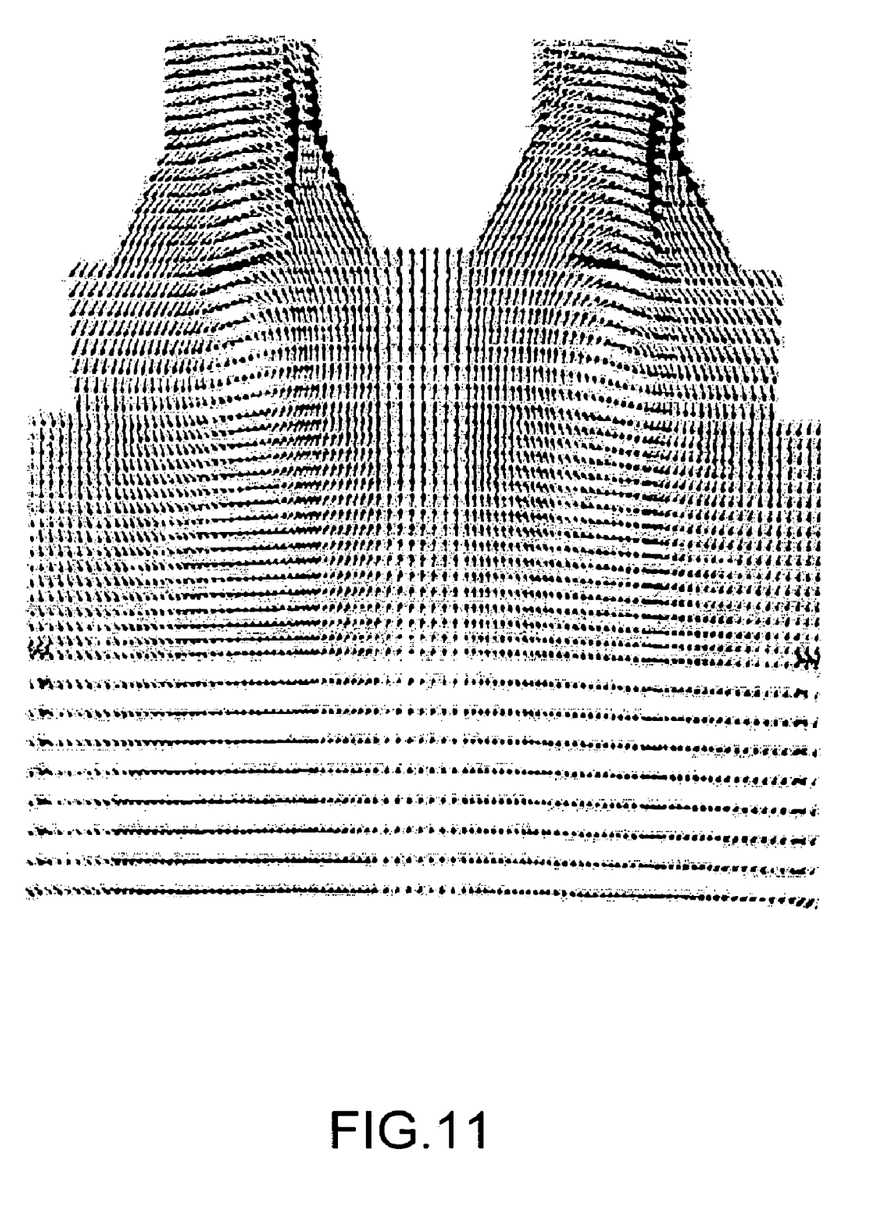
FIG. 11 is a vector diagram showing a simulation of vibration displacement while the resonating arms included in the piezoelectric resonator element according to the third embodiment is performing flexural vibration.

FIG. 11 is a vector diagram showing a simulation of vibration displacement while each resonating arm is performing flexural vibration in the third embodiment. The structure of FIG. 11 shows smaller distortion around lower portions of the base than the structure of FIG. 7.

Figure 12:
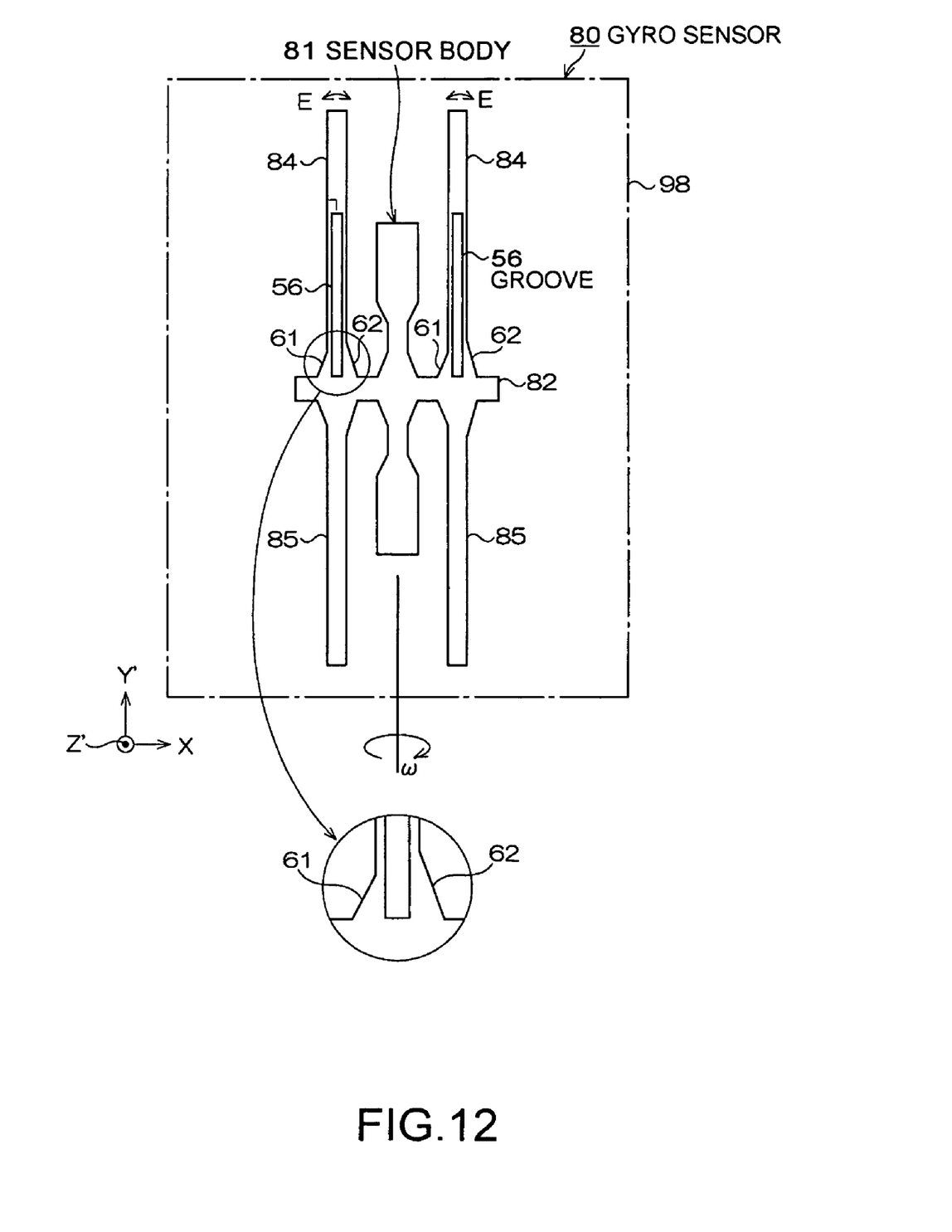
FIG. 12 is a schematic plan view of a gyro sensor according to a fourth embodiment.

FIG. 12 is a plan view schematically showing a structure of a gyro sensor that is a crystal resonator element as a fourth embodiment of the invention.

In FIG. 12, the X direction is the electric axis of crystal, the Y' direction is the mechanical axis of crystal, and the Z' direction is the optical (growth) axis of crystal.

Referring to FIG. 12, this gyro sensor 80 includes a sensor body 81 housed in a package 98. The package 98 has an inside structure that is almost the same as the package 36 described in the first embodiment and is like a box in which the sensor body 81 can be housed. Provided inside this package are a driving means, such as an excitation circuit, that excites the sensor body 81, and a circuit etc. that detects vibration from the censor body 81 (these circuits are not shown).

The censor body 81 is formed by etching crystal and in the same process that manufactures the piezoelectric resonator element according to the first embodiment. This means that while the shape of the censor body 81 differs from that of the piezoelectric resonator element of the first embodiment, the outer shape and groove of the body that will be described below can be achieved by the same manufacturing process.

Referring to FIG. 12, a base 82 that is long in the right-left direction of the censor body 81 is fixed to the package 98.

From around the right and left end portions of the base 82, excitation resonating arms 84, 84 extend orthogonally to the direction in which the base 82 extends, and upward in FIG. 12 in parallel with each other. Also from around the right and left end portions of the base 82, detection resonating arms 85, 85 extend orthogonally to the direction in which the base 82 extends, and downward in FIG. 12 in parallel with each other.

The long groove 56 is provided to the front surface of each of the excitation resonating arms 84, 84 along its longitudinal direction. In each groove, an excitation electrode (not shown) is provided in the same manner as the first embodiment. In the same manner, a groove is also provided to the front and back surfaces of each of the detection resonating arms 85, 85. In each groove, a detection electrode (not shown) is provided.

Referring to FIG. 12, the excitation resonating arms 84, 84 included in the gyro sensor 80 vibrate in a way that their end parts move closer to and away from each other as shown by the arrows E in response to a driving voltage applied from the excitation circuit (not shown) as a driving means. When a rotation angular velocity ω around the Y' axis as shown in FIG. 12 is applied, the excitation resonating arms 84, 84 are subject to the Coriolis force Fc based on the velocity V of the resonating arms in the X axis direction and the rotation angular velocity ω, and the arms vibrate along the Z' axis (alternatively in the positive Z' direction and the negative Z' direction) in accordance with the formula below (walk vibration). This vibration is transmitted to the detection resonating arms 85, 85 via the base 82.

$$Fc = 2mV \cdot \omega \text{ (}m\text{=mass of vibrating parts of the excitation resonating arms 84, 84; } V\text{=velocity of the excitation resonating arms 84, 84)} \quad \text{Formula (1)}$$

An electric field based on the vibration of the detection resonating arm 85 is output as a signal by the detection electrode (not shown), thereby detecting the rotation angular velocity ω.

Moreover, also in the present embodiment, the constricted portions 61, 62 at the base portion of the resonating arms 84 are used to adjust the hardness balance between the right and left sides of each resonating arm 84 due to the etching anisotropy in providing the long groove 56. The constricted portion 62 on one side of the long groove 56 in the width direction is made large, while the constricted portion 61 on the other side of the long groove 56 in the width direction has a normal size. In other words, when each of the resonating arms 84, 84 is provided to extend upward from the base 51, the constricted portion 62 on the right is made large, while the constricted portion 61 on the left is made smaller to have a normal size as shown in the enlarged view. Although detailed description is omitted here, a long groove is also provided to each of the resonating arms 85, 85 extending downward from the base 82 in FIG. 13 and constricted portions are also provided in the same manner as mentioned above.

Accordingly, by providing the large constricted portion 62 on the right of the resonating arms at the base portion of the arms, which has the largest distortion, the hardness can be increased on the right of the resonating arms while the resonating arms are performing flexural vibration.

Note that the resonating arms included in the gyro sensor 80 may have the structure described in FIG. 8 or FIG. 10 instead of or in addition to the structure that adjusts the balance that has been described referring to FIG. 13.

It should be understood that the invention is not limited to the above-described embodiments. The structure of each embodiment can be appropriately combined or omitted, and an additional structure not shown can also be combined therewith.

Furthermore, the invention is applicable to any piezoelectric resonator elements and any piezoelectric devices using such piezoelectric resonator elements as long as these elements are housed in a package. Examples of such elements may include crystal resonator elements, crystal oscillators, gyroscopes and angle sensors.

While the packages used in the above-described embodiments are like boxes made of ceramic, the invention is not limited to this. The invention is applicable to any packages and cases including containers that are equivalent to the packages as long as they house a piezoelectric resonator element, e.g. a metal cylinder case.

What is claimed is:

1. A piezoelectric resonator element, comprising:
   a base made of a piezoelectric material;
   at least a pair of resonating arms provided in a unified manner with the base and extending in parallel with each other from the base;
   a portion defining a long groove provided to each of the resonating arms along a longitudinal direction;
   a driving electrode provided to the long groove;
   wherein each of the resonating arms includes a structure to adjust hardness balance between right and left structures with respect to a virtual central line extending in the longitudinal direction; and
   wherein a right constricted portion and a left constricted portion with respect to the virtual central line are provided to a base portion of each of the resonating arms so as to make a width of the resonating arms large on the base side and make the width sharply reduce toward each end portion, and the right constricted portion is made larger than the left constricted portion as the structure to adjust.

2. A piezoelectric resonator element, comprising:
   a base made of a piezoelectric material;
   at least a pair of resonating arms provided in a unified manner with the base and extending in parallel with each other from the base;
   a portion defining a long groove provided to each of the resonating arms along a longitudinal direction;
   a driving electrode provided to the long groove;
   wherein each of the resonating arms includes a structure to adjust hardness balance between right and left structures with respect to a virtual central line extending in the longitudinal direction; and
   wherein the structure to adjust is disposed proximate to a base portion of each of the resonating arms and the long groove includes a first width at the structure to adjust and a second width, different than the first width, between an end of the structure to adjust and an end of a respective resonating arm.

3. A piezoelectric resonator element, comprising:
   a base made of a piezoelectric material;
   at least a pair of resonating arms provided in a unified manner with the base and extending in parallel with each other from the base;
   a portion defining a long groove provided to each of the resonating arms along a longitudinal direction;
   a driving electrode provided to the long groove;
   wherein each of the resonating arms includes a structure to adjust hardness balance between right and left structures with respect to a virtual central line extending in the longitudinal direction; and
   wherein the structure to adjust is disposed at an end portion of each of the resonating arms and includes a first portion that is larger than a second portion with respect to the virtual central line, the first portion extending in the same direction from the virtual center line on each resonating arm.

4. The piezoelectric resonator element of claim 1, wherein the piezoelectric resonator element is incorporated into a piezoelectric device and is housed in a container.

5. The piezoelectric element of claim 1, wherein the piezoelectric element is a base of a gyro sensor.

6. The piezoelectric resonator element of claim 2, wherein the piezoelectric resonator element is incorporated into a piezoelectric device and is housed in a container.

7. The piezoelectric element of claim 2, wherein the piezoelectric element is a base of a gyro sensor.

8. The piezoelectric element of claim 2, wherein the first width is less than the second width.

9. The piezoelectric element of claim 2, wherein the structure to adjust includes a wider part formed on a first wall of each of the resonating arms.

10. The piezoelectric element of claim 9, wherein the wider part extends into the long groove to define the first width between the wider part and a second wall of the respective resonating arm opposite to the first wall.

11. The piezoelectric resonator element of claim 3, wherein the piezoelectric resonator element is incorporated into a piezoelectric device and is housed in a container.

12. The piezoelectric element of claim 3, wherein the piezoelectric element is a base of a gyro sensor.

* * * * *